United States Patent [19]
Mok et al.

[11] Patent Number: 6,098,901
[45] Date of Patent: Aug. 8, 2000

[54] APPARATUS FOR DISPENSING SLURRY

[75] Inventors: Peter Mok, San Francisco; Jon Chun, San Jose, both of Calif.

[73] Assignee: Aplex, Inc., Sunnyvale, Calif.

[*] Notice: This patent is subject to a terminal disclaimer.

[21] Appl. No.: 09/113,727

[22] Filed: Jul. 10, 1998

Related U.S. Application Data

[63] Continuation-in-part of application No. 08/965,067, Nov. 5, 1997, Pat. No. 5,964,413.

[51] Int. Cl.[7] .................. B05B 3/02; B05B 3/10
[52] U.S. Cl. ............ 239/223; 239/104; 239/106; 239/214; 239/215; 239/219; 239/224
[58] Field of Search .................... 239/214, 215, 239/219, 223, 224, 104, 106

[56] References Cited

U.S. PATENT DOCUMENTS

| | | | |
|---|---|---|---|
| Re. 30,963 | 6/1982 | Moller et al. ............ | 239/224 |
| 1,488,356 | 3/1924 | Linke ..................... | 239/219 |
| 1,535,147 | 4/1925 | Colpitts .................. | 239/219 |
| 2,537,833 | 1/1951 | Joos ...................... | 239/219 X |
| 2,783,088 | 2/1957 | Butler .................... | 239/215 |
| 5,203,506 | 4/1993 | Gross et al. .............. | 239/224 |

*Primary Examiner*—Andres Kashnikow
*Assistant Examiner*—Robin O. Evans
*Attorney, Agent, or Firm*—Skjerven,Morrill,MacPherson Franklin and Friel; Roberta Saxon

[57] ABSTRACT

A slurry dispenser dispensing slurry by a pair of counter-rotating wheels is provided in a chemical mechanical polishing process used in manufacturing integrated circuits. The slurry dispenser is driven by variable speed motors at a predetermined speed empirically determined to dispense a desired amount of slurry. The shape of the rotating wheels controls the vertical distribution of the spray. Openings in the housing of the slurry dispenser and the speed of rotation of the wheels controls the horizontal distribution of the spray. The slurry dispenser can be constructed out of materials chemically inert with respect to the slurry.

12 Claims, 4 Drawing Sheets

APPARATUS FOR DISPENSING SLURRY

CROSS-REFERENCE TO RELATED APPLICATION

This application is a continuation-in-part of U.S. patent application Ser. No. 08/965,067 entitled "APPARATUS FOR DISPENSING SLURRY", filed Nov. 5, 1997 U.S. Pat. No. 5,964,413, issued on Oct. 12, 1999.

BACKGROUND OF THE INVENTION

1. Field of the Invention

The present invention relates to dispensing a liquid. In particular, the present invention relates to dispensing slurry in a chemical-mechanical polishing (CMP) application.

2. Discussion of the Related Art

In sub-micron integrated circuits, CMP techniques are used to create the planarity required in multi-level interconnect structures. Specifically, to create a planar surface for depositing an interconnect layer, e.g. aluminum, tungsten, or copper, an interlayer dielectric (e.g., silicon dioxide) is planarized by a polishing process which uses an alkaline or acidic slurry with fine abrasive. One example of such a slurry includes fine silicon dioxide particles (e.g., average diameter of 70 nm) suspended in deionized water having an adjusted pH of approximately 11. The alkalinity can be provided by potassium hydroxide (KOH) and ammonium hydroxide ($NH_3OH$) For other applications, acidic slurries are used.

Typically, in a CMP polisher, the semiconductor wafer to be polished is held under slight pressure by a polishing head against a polishing pad. For a CMP application, the polishing pad is typically made of a polyurethrane material. During the polishing process, the polishing head moves the semiconductor wafer according to a predetermined motion pattern. Alternatively, the polishing pad can be mounted on a platform which moves relative to the semiconductor wafer. The motion of the semiconductor wafer relative to the polishing pad and the mechanical and chemical actions of the slurry, together provide a polishing action for planarizing the surface of the wafer. In such a process, because the slurry has a high content of water, the slurry is not only an abrasive, but also acts as a coolant which maintains the surface of the wafer to an acceptable temperature.

In the prior art, the slurry is typically sprayed onto the surface of the polishing pad by appropriately positioned nozzles linked by a slurry supply line, and delivered to the surface of the polishing pad at 50 to 500 cc per minute using a peristalic pump. However, a number of problems can develop over time under this arrangement. In particular, deposits from the slurry can clog the nozzles, leading to uneven and inadequate delivery. In some situations, uneven and inadequate slurry delivery can result in poor polishing uniformity and even severe damage to the wafer due to excessive heat. In addition, even when nozzles are in good working condition, it is difficult to control the amount of slurry that is dispensed. Further, it is important to provide a means of cleaning the slurry dispensing apparatus. When allowed to dry out, slurry forms flakes which, if deposited on semiconductor wafers, can degrade integrated circuit performance.

SUMMARY OF THE INVENTION

In accordance with the present invention, a self-cleaning slurry dispenser which dispenses slurry from two counter-rotating wheels is provided.

In one embodiment, the slurry dispenser includes: (a) a housing having two openings; (b) two reservoirs provided inside the housing for holding the slurry; (c) two rotating mechanisms, such as motors, and (d) two wheels provided within the housing and engaged to rotate with said rotational mechanisms. In that embodiment, the wheels include a conically-shaped portion inserted into the slurry reservoir and a disk-shaped portion. During operation, i.e., while the wheels are rotated by the rotating mechanism, a stream of slurry is forced up a side wall of the conical portion of the wheels, so that the slurry is dispensed as a spray by the disk portions through the openings of the housing. The spray is created by a centrifugal force resulting from the rotation. If a variable speed DC motor is used, the amount of slurry dispensed by the slurry dispenser and the horizontal slurry distribution pattern can be controlled by an applied voltage to the motor.

The housing, the wheels and any surface that comes into contact with the slurry, can be constructed from a synthetic material (e.g., polypropylene, polyvinylidene fluoride (PVDF), or any material with a coating of polytetrafluoroethylene, known by the tradename TEFLON™, on exposed surfaces) which is chemically inert with respect to the slurry. The shape of the openings in the housing restricts the slurry spray to a predetermined angle.

An inlet is provided in the slurry dispenser for attaching a slurry supply line to maintain a continuous supply of slurry into the slurry reservoir of the slurry dispenser.

In one embodiment, the slurry dispenser includes a sliding door operated by an air cylinder and an inlet for cleaning water such that when the sliding door is closed the housing can be washed without operator intervention and without cross contamination between the interior and the exterior of the housing.

The slurry dispenser of the present invention allows even distribution of slurry across the polishing pad and fine control of the amount of slurry dispensed, so that waste of slurry is minimized. Furthermore, the slurry dispenser of the present invention is self-cleaning.

The present invention is better understood upon consideration of the detailed description below in conjunction with the accompanying drawings.

DETAILED DESCRIPTION OF THE PREFERRED EMBODIMENTS

Figures 1A, 1B:
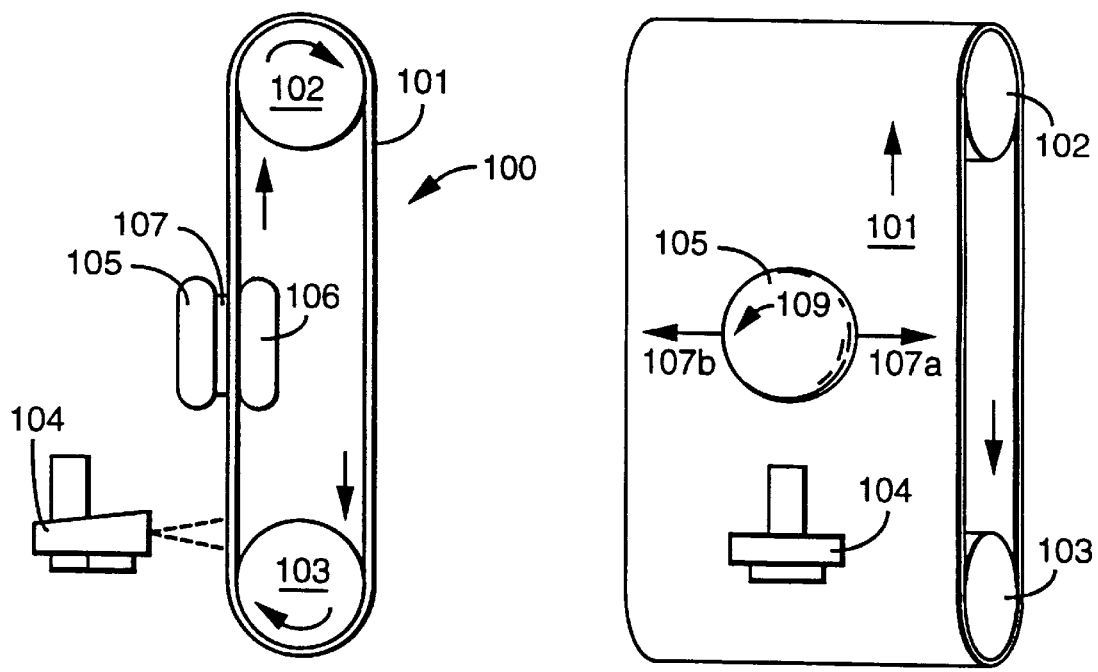
FIGS. 1a and 1b show, respectively, schematic front and side views of a CMP apparatus 100, including a slurry dispenser 104, in accordance with the present invention.

The present invention provides a slurry dispenser free of the problems of the prior art described in the previous section. To simplify the detailed description below, like elements in the figures are provided like reference numerals.

FIGS. 1a and 1b show CMP apparatus 100 in side and front views, respectively. One example of a polishing apparatus suitable for use as CMP apparatus 100 is disclosed in U.S. patent application Ser. No. 08/964,930 entitled "Modular Polishing Apparatus and Method," now U.S. Pat. No. 5,957,764. As shown in FIGS. 1a and 1b, CMP apparatus 100 includes a continuous polishing belt 101 configured to polish one or more vertically held semiconductor wafers, such as wafer 107. Wafer 107 is held vertically by a polishing head 105, which presses wafer 107 against a polishing pad attached to a vertically mounted polishing belt 101. Polishing belt 101 is kept in continuous motion by rotating pulleys 102 and 103 at a selected polishing speed (e.g., 10 meters per second). A support assembly 106 provides a backward pressure to hold wafer 107 at a preselected pressure (e.g., 5 psi) against polishing belt 101. Polishing head 105 rotates in a predetermined direction indicated by reference numeral 109 and is optionally moved back and forth across the polishing pad surface in straight lines indicated by reference numerals 107a and 107b. While FIG. 1 shows only one side of the polishing belt assembly being used for wafer polishing, polishing heads and accompanying mechanisms can be provided on both sides of the polishing belt assembly of CMP apparatus 100 to increase the total wafer throughput.

Figure 2:
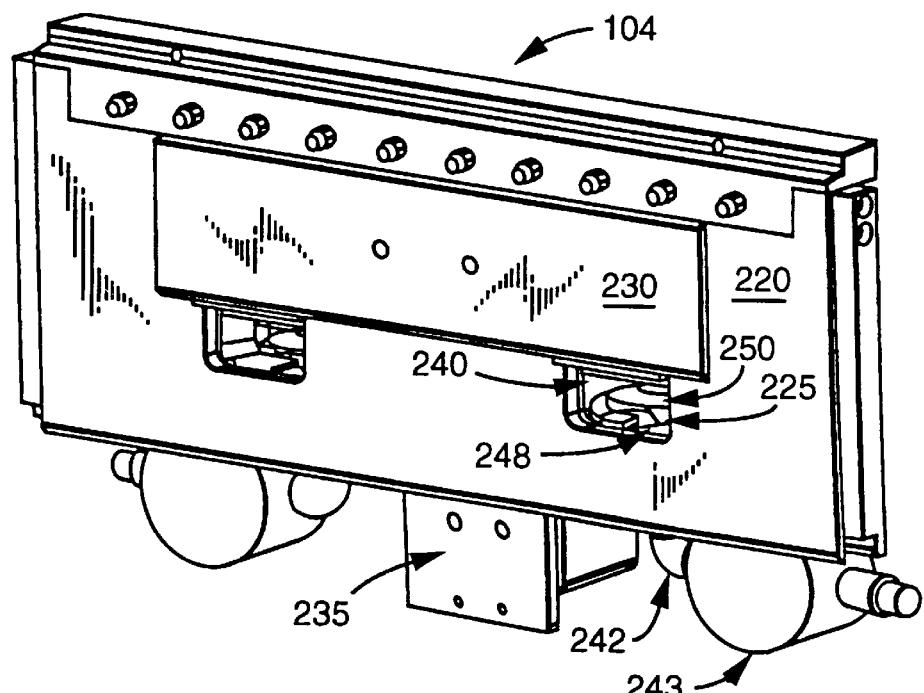
FIG. 2 shows a front isometric view of slurry dispenser 104.

The present invention provides a slurry dispenser 104, which is positioned at a short distance upstream (relative to polishing belt 101's direction of travel) from polishing head 105. Slurry dispenser 104 sprays a fine stream of slurry from a pair of rapidly counter-rotating wheels. FIG. 2 provides an isometric view of the front of slurry dispenser 104. As shown in FIG. 2, slurry dispenser 104 includes a front face 220 with openings 225 to the wheel housing 240 positioned behind the front face. Openings in wheel housing 240 align with the openings 225 in front face 220. The interior of wheel housing 240, contains two wheels 250, positioned above slurry reservoir slots 248 in the bottom face of the housing interior.

Figure 3A:
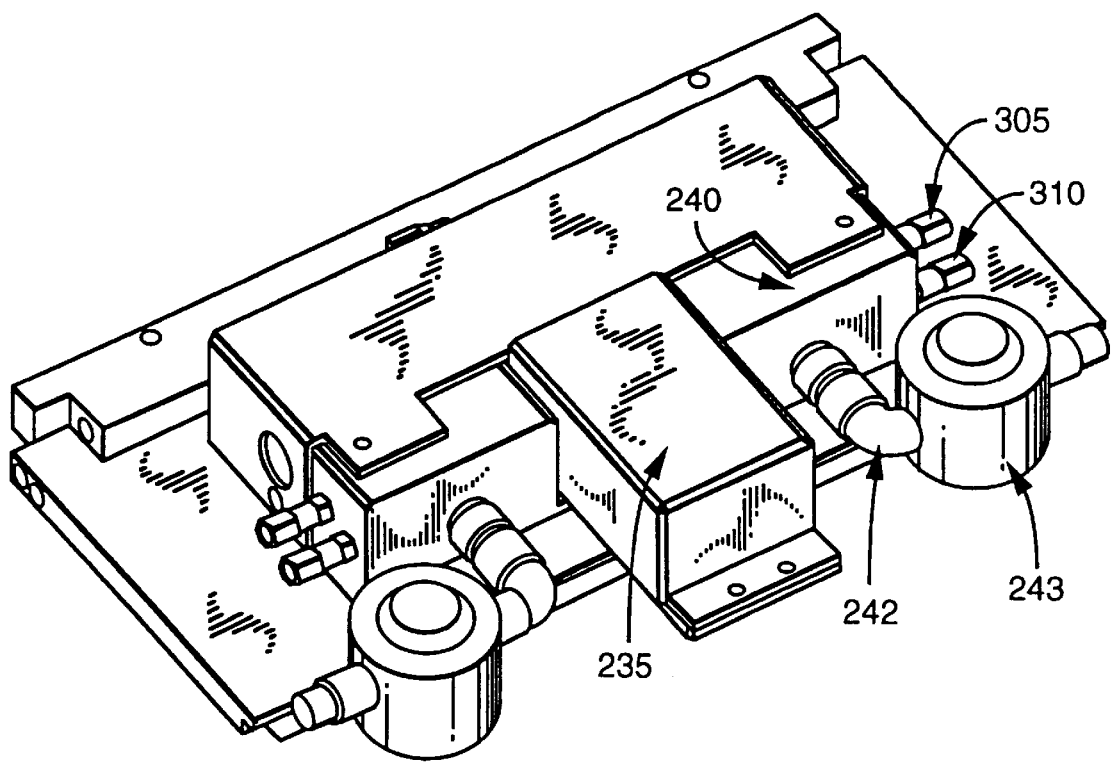
FIG. 3a shows a back isometric view of slurry dispenser 104.
Figure 3B:
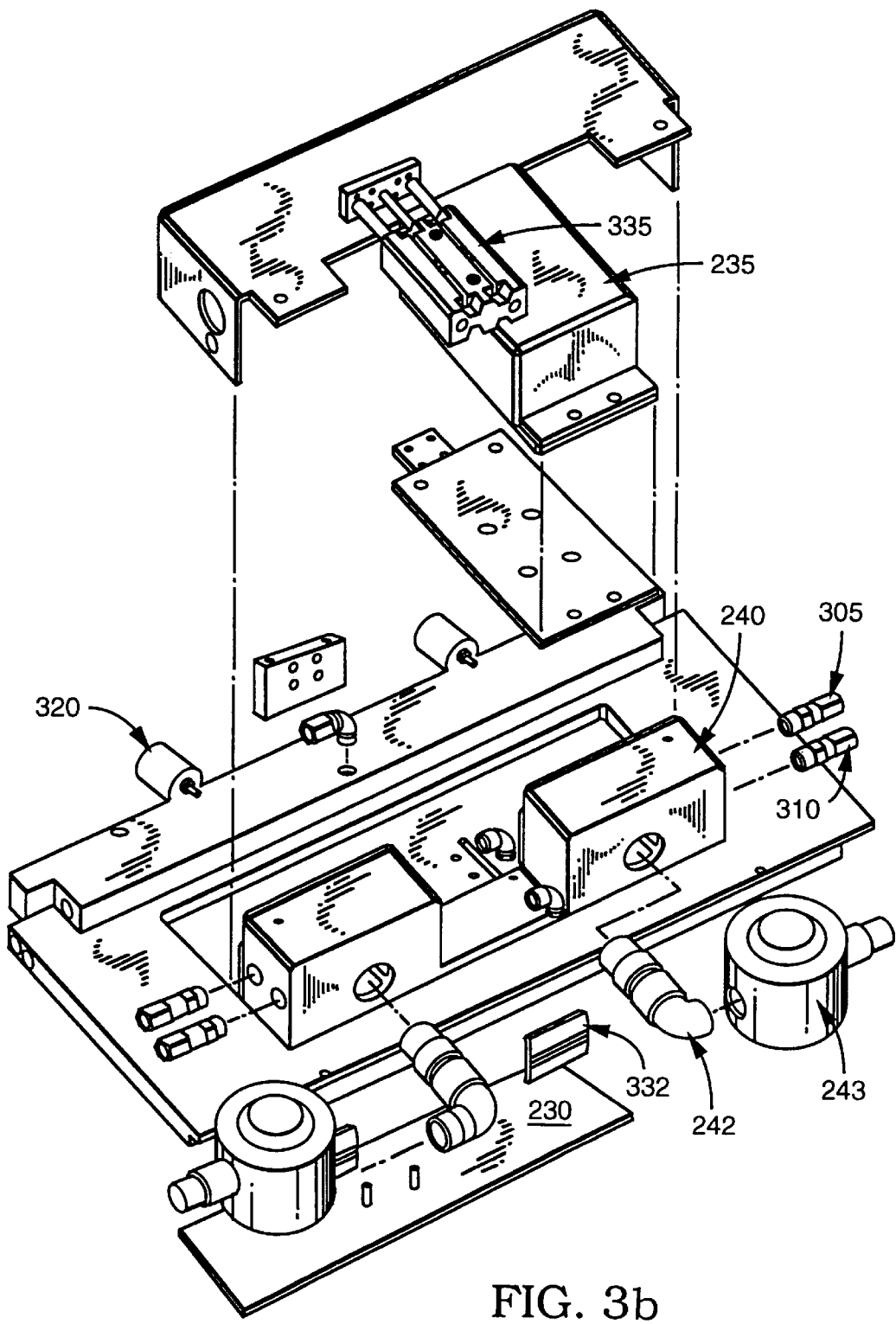
FIG. 3b shows an "exploded" back view of slurry dispenser 104.
Figure 4:
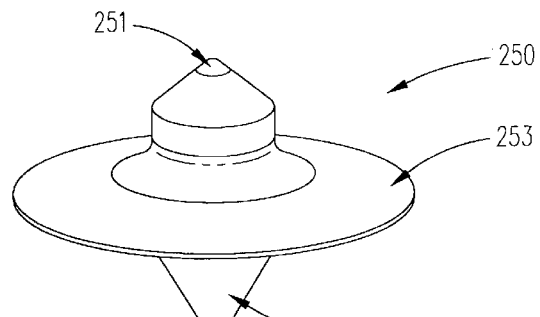
FIG. 4 shows wheel 250.
Figure 5:
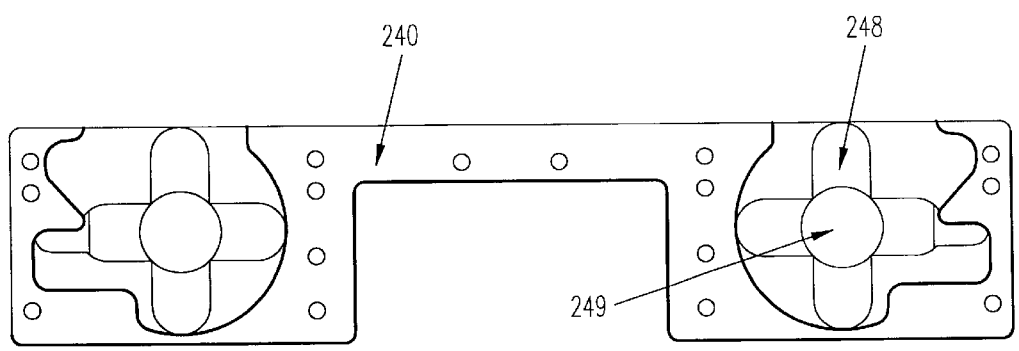
FIG. 5 shows a top view of wheel housing with the wheels removed to reveal the reservoirs 248.

Referring to the back view of slurry dispenser 104 in FIGS. 3a and 3b, the exterior of wheel housing 240 is shown. Wheel housing 240 is connected to slurry inlet lines 310, which are connected during operation to slurry supply lines (not shown) to provide slurry dispenser 104 a continuous supply of slurry. A peristolic pump can be used to provide the slurry in the supply lines. A pair of variable speed motors 320 is positioned above wheel housing 240. Motors 320 are preferably DC motors whose speed can be varied by varying the magnitude of an applied voltage. Motors 320 have a rotating shaft extending downward which fits into a slot 251 on the top of wheels 250, as illustrated in FIG. 4. The bottom portion of wheels 250 is a conical portion 252. A disk portion 253 is positioned above the conical portion. Two sets of slurry reservoir slots 248 at the bottom of wheel housing 240 are shown in FIG. 5, which provides a top view of the wheel housing with the wheels removed. During operation wheels 250 are placed such that the bottom point of the conical portion 252 is positioned at the center crossing points 249 of slurry reservoir slots 248. The design of slurry reservoir slots 248 advantageously minimizes the use of slurry.

Figure 6:
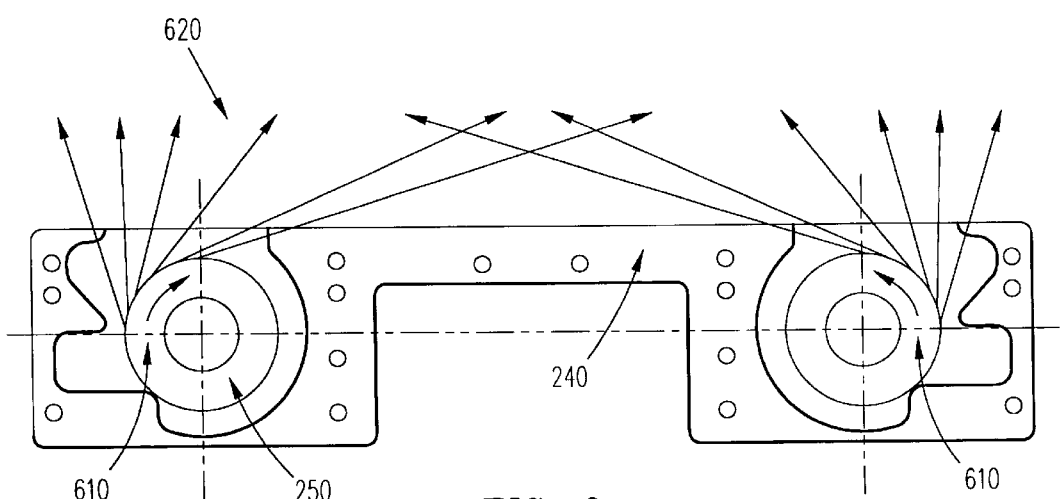
FIG. 6 illustrates the operation of slurry dispenser 104 using a view from the top of the interior of wheel housing 240.

The operation of slurry dispenser 104 is described in conjunction with FIG. 6. FIG. 6 is a view of slurry dispenser 104 viewed from the ceiling of the interior of wheel housing 240. During operation, motors 320 turns wheels 250 in opposite directions 610 at a predetermined speed (e.g., 3000 to 6000 revolutions per minute). This provides an overlapping spray of slurry as indicated by slurry distribution arrows 620. The desired operational speed of the motor is primarily determined by the amount of slurry required to be dispensed and the desired distribution pattern. Generally, a higher speed would dispense a greater amount of slurry and provide greater overlap in the center of the distribution. However, a higher speed also results in a smaller droplet size, while a larger droplet size is desired to reduce misting. The preferred speed can be determined empirically as a tradeoff between flow rate and droplet size. A typical rate of supplying slurry through slurry supply lines 310 is approximately 450 ml/min.

At the operational speed, a stream of slurry is forced to creep up from slurry reservoir slots 248 along a side wall of the conical portion 252 of wheels 250, due to the boundary layer created at the surface of the conical portion. This stream of slurry flow continues over the lower surface of the disk portion 253 of wheels 250. The centrifugal force of spinning wheel 250 sprays the slurry out of slurry dispenser 104 through openings of wheel housing 240. The sharp edges of the disk portion of wheels 250 serve to restrict the spray to a thin layer in the vertical direction.

In this embodiment, the sloping sidewalls of conical portion 252 are inclined approximately 120 degrees from disk portion 253. The shape of opening 225 in front face 220 and the corresponding shape of the openings in wheel housing 240 determine the horizontal width of the slurry distribution. Wheel housing 240 and wheels 250 can be constructed out of polypropylene, polyvinylidene fluoride (PVDF), Kynar, any material with a polytetrafluoroethylene, known by the tradename TEFLON™, on exposed surfaces, or any other material inert to the slurry (e.g. a hard plastic). Fittings are typically TEFLON. Drains and supply lines, discussed below, are typically constructed of TEFLON or PVDF. All the corners of the interior of wheel housing 240 are rounded for ease of cleaning of slurry dispenser 104, as described below.

Slurry dispenser 104 also includes a sliding door 230, which can be closed to permit washing of the interior of wheel housing 240. Sliding door 230 is operated by air cylinder 335 enclosed in air cylinder housing 235, shown in FIGS. 3a and 3b. Water for cleaning is supplied from water inlet lines 305. Wheel housing 240 is drained through slurry drain lines 242 which are connected to slurry drain valves 243. During typical operation, wheel housing 240 is washed between polishing of each wafer without operator intervention.

Sliding door 230 also includes an attached pair of gutters 332. Gutters 332 are constructed of plastic with vinyl hinges. When sliding door 230 is closed, gutters 332 are folded inside and are washed by the water supplied from water inlet lines 310. When sliding door 230 is open, gutters 332 extend horizontally over openings 225 in front face 220, as shown in FIG. 2, and protect the interior of wheel housing 240 from any liquid flowing down front face 220. During typical operation of slurry dispenser 104, water flows down front face 220. Sliding door 230 and gutter 332 advantageously allow the interior and exterior of wheel housing 240 to be washed without cross contamination. That is, slurry from inside wheel housing 240 is prevented from being washed onto the polishing pad attached to polishing belt 101, and exterior washing is prevented from diluting slurry inside wheel housing 240.

The detailed description above is provided to illustrate the specific embodiments described herein and is not intended to be limiting. Numerous variations and modifications within the scope of the present invention are possible. For example, while the present invention is illustrated by a CMP apparatus, the present invention is suitable for use with any polishing apparatus. The present invention is defined by the following claims.

We claim:

1. A slurry dispenser, comprising:

a housing having two openings;

two reservoirs provided within said housing for holding a slurry;

two rotating mechanisms; and two wheels within said housing, said wheels engaged to rotate with said rotating mechanisms, said wheels including disk portions and conduits for carrying said slurry from said reservoirs to said disk portions, such that when said wheels are rotating, a stream of slurry is forced up said conduits into said disk portions and dispensed cooperatively as a spray by said disk portions through said openings, providing an even distribution of slurry.

2. A slurry dispenser as in claim 1, wherein said rotating mechanisms are operated to rotate said wheels in opposite directions.

3. A slurry dispenser as in claim 1, wherein said conduits of said wheels comprise conical portions inserted into said reservoirs.

4. A slurry dispenser as in claim 1, wherein said rotating mechanisms comprise variable speed motors.

5. A slurry dispenser as in claim 1, wherein said wheels and said housing comprises material chemically inert with respect to said slurry.

6. A slurry dispenser as in claim 5, wherein said material comprises polypropylene.

7. A slurry dispenser as in claim 5, wherein said material comprises polyvinylidene fluoride (PVDF).

8. A slurry dispenser as in claim 5, wherein said material comprises a polytetrafluoroethylene coating.

9. A slurry dispenser as in claim 1, further comprising slurry inlets for providing continuous supplies of slurry into said reservoirs.

10. A slurry dispenser as in claim 1, further comprising:

a sliding door with an open and a closed position, such that in the closed position, the sliding door covers said openings in said housing, an air cylinder operating said sliding door; and water inlet lines for providing cleaning water to said housing.

11. A slurry dispenser as in claim 10, further comprising drain lines and drain valves for emptying said housing after cleaning.

12. A slurry dispenser as in claim 10, further comprising gutters attached to said sliding door such that when said sliding door is in the open position, the gutters project over said openings.

* * * * *